(12) United States Patent
Chung et al.

(10) Patent No.: US 6,614,292 B1
(45) Date of Patent: Sep. 2, 2003

(54) BOOSTING CIRCUIT OF SEMICONDUCTOR MEMORY DEVICE

(75) Inventors: Hwi-Taek Chung, Kyunggi-do (KR); Yeon-Bae Chung, Colorado Springs, CO (US); Myong-Jae Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/626,831

(22) Filed: Jul. 27, 2000

(30) Foreign Application Priority Data

Jul. 28, 1999 (KR) .............................................. 99-30871

(51) Int. Cl.[7] .................................................. G05F 1/10
(52) U.S. Cl. ...................................................... 327/536
(58) Field of Search ................................ 327/530, 534, 327/535, 536, 537

(56) References Cited

U.S. PATENT DOCUMENTS 5,095,223 A * 3/1992 Thomas ....................... 307/110
5,434,820 A * 7/1995 Kim ........................ 365/189.09
5,481,447 A * 1/1996 Caris et al. ..................... 363/60
6,023,187 A * 2/2000 Camacho et al. ............ 327/536
6,137,342 A * 10/2000 McAdams et al. .......... 327/534
6,208,198 B1 * 3/2001 Lee ............................. 327/536
6,278,318 B1 * 8/2001 Watanabe .................... 327/536

* cited by examiner

*Primary Examiner*—Jeffrey Zweizig
(74) *Attorney, Agent, or Firm*—Marger Johnson & McCollom, P.C.

(57) ABSTRACT

A boosting unit comprises a plurality of boosting circuits. Each boosting circuit includes an input driving circuit, a switching circuit, a capacitor circuit, and a precharge circuit. The input driving circuit drives a corresponding external boosting signal. The switching circuit transfers either a power supply voltage, a ground voltage, or a boosting signal from one of the other boosting circuits to the capacitor circuit under the control of the corresponding external boosting signal. The capacitor circuit boosts up a boosting node, which has been precharged to a power supply voltage level by the precharge circuit, to predetermined voltage level higher than an input voltage level. The boosting circuits are connected together in series and simultaneously carry out a boosting operation. The boosting unit therefore provides a desired boosted voltage level at high speed.

12 Claims, 14 Drawing Sheets

750

| Fig.8A | Fig.8B |
|--------|--------|
| BOOST1 | BOOSTn |

BOOSTING CIRCUIT OF SEMICONDUCTOR MEMORY DEVICE

This application claims priority from Korean Patent Application No. 1999-30871, filed on Jul. 28, 1999, the contents of which are herein incorporated by reference in their entirety.

FIELD OF THE INVENTION

The present invention relates generally to a semiconductor memory device. More specifically, the present invention is directed to a boosting circuit of a semiconductor memory device.

BACKGROUND OF THE INVENTION

Referring to FIGS. 1 and 2, a conventional flash memory cell 1 comprises a current path or channel region 5 formed between a source 3 and a drain 4 on a semiconductor substrate 2. A floating gate 6 is formed on the substrate 2 between insulating layers 7 and 9, and has a predetermined thickness (e.g., approximately 100 Å). A control gate 8 is formed above the floating gate 6.

TABLE 1

| Operation Mode | Vg | Vd | Vs | Vb |
|---|---|---|---|---|
| Program | +10V | +5V~+6V | 0V | 0V |
| Erase | −10V | Floating | Floating | +6V |
| Erase Correction | +3V | +5V~+6V | 0V | 0V |
| Read | +4.5V | +1V | 0V | 0V |

Bias Voltages for Flash Memory Device Operations

Table 1 shows bias voltages for various operations of a flash memory device. As shown in Table 1, during a programming operation, a source voltage Vs, of the source region 3, and a bulk voltage Vb of the semiconductor substrate (or bulk region) 2, are grounded to 0V. A positive high program voltage Vpgm of around 10~20V is applied as a control gate voltage Vg to the control gate 8, while a drain voltage Vd of approximately 5~6V is applied to the drain region 4. Using these bias voltages, hot carriers are generated to program the flash memory cell 1. More specifically, electrons of the bulk region 2 are stored in the floating gate 6 as a result of the electric field generated by the high program voltage Vpgm being applied to the control gate 8. Meanwhile, charges supplied to the drain region 4 are accumulated, generating the hot carriers. After a flash memory cell 1 has been programmed, it will preferably have a program threshold voltage within a predetermined program voltage distribution area. As shown in FIG. 2, a threshold voltage distribution area for an "off" (programmed) cell ranges between approximately 6~8V.

As further shown below in Table 1, during an erasing operation, a negative high erase voltage Vera of approximately −10~−20V is applied as the control gate voltage Vg to the control gate 8 while a voltage of about 5V is applied as the bulk voltage Vb to the bulk region 2. Using these voltages, a Fowler-Nordheim (F-N) tunneling phenomenon is created to erase the flash memory cell 1. This F-N tunneling discharges the electrons accumulated in the floating gate 6, so that the flash memory cells have an erased threshold voltage within a predetermined voltage distribution area. As shown in FIG. 2, a threshold voltage distribution area for an "on" (erased) cell ranges from approximately 0.5~2.5V (or between about 1~3V).

In a read operation, a flash memory cell with a high threshold voltage, as a result of the program operation, registers as an "off" cell. This is because current flow from the drain region 4 to the source region 3 is prevented. Because current is permitted to flow from the drain region 4 to the source region 3 during a read operation in a flash memory cell with a low threshold voltage, such a cell appears as an "on" cell.

In a flash memory cell array, the flash memory cells included in one sector are simultaneously erased because they share the same bulk region 2. Due to the lack of uniformity in threshold voltages between flash memory cells, however, when all of the flash memory cells in a sector are erased at the same time, the threshold voltage of one or more of the flash memory cells often drops below the minimum desirable erased cell threshold voltage distribution level. Erased flash memory cells that have a threshold voltage of 0V or less are called "over-erased memory cells". To correct over-erased memory cells, a series of over-erase repair operations should be performed. Over-erase repair operations increase the threshold voltage of the over-erased flash memory cells to within the desired erased threshold voltage distribution area.

Referring to FIG. 3, a conventional multi-bank NOR flash memory device comprises memory cell arrays 11, 21, row decoders 13, 23, column decoders 15, 25, latch and control circuits 17, 27, an input/output (I/O) interface circuit 30, an erase control circuit 40, a program control circuit 50, a block data storage circuit 60, and a high voltage generation circuit 70. A nonmulti-bank NOR-type memory device, on the other hand, comprises only a single memory cell array, row decoder, column decoder, and latch and control circuit.

Referring to FIGS. 1, 2, and 3, in general, operation of the flash memory device is divided into program, erase, and read operations. As mentioned above, the program operation is performed by injecting electrons into the floating gate 6 using hot electrons created at a channel 5 of a memory cell 1. The erase operation is performed by discharging the electrons in the floating gate 6 to the substrate 2 using F-N tunneling. The read operation is performed by applying a wordline voltage W/L Voltage of around 3.5~5V to a control gate 8 of the memory cell 1.

It should be noted that the wordline voltage for the read operation is selected between the uppermost erased cell threshold voltage distribution level (approximately 2.5V) and the lowermost programmed cell threshold voltage distribution level (approximately 6V). The multi-bank NOR flash memory device supplies a respectively independent address to the banks 11, 21 from the I/O interface circuit 30, thereby enabling an operation such as a read while write (RWW) operation. Those skilled in the art understand the program, erase, and read operations of the multi-bank flash memory device, and a detailed description thereof will therefore be omitted.

The trend in semiconductor memory devices is toward lower operating voltages. A typical flash memory device must operate in an extremely low voltage range (e.g., below 2V or 1.7V). A high voltage generation circuit 70 uses the low operating voltage to generate the high voltages (e.g., the program voltage Vpgm, erase voltage Vera, and read voltage Vrea) supplied to the control gate 8 of the memory cell 1. This circuit 70 therefore plays an important role in the execution of the cell operations. The design and construction of the high voltage generation circuit 70 is therefore important in maintaining fast operational speeds in the NOR-type flash memory device.

Referring to FIGS. 3 and 4, a conventional high voltage generation circuit 70 comprises a program voltage generation circuit 71, an erase voltage generation circuit 73, and, a read voltage generation circuit 75. The program voltage generation circuit 71 generates a program voltage Vpgm by controlling the program control circuit 50 and the latch and control circuits 17, 27. The erase voltage generation circuit 73 generates an erase voltage Vera by controlling the erase control circuit 40 and the latch and control circuits 17, 27. The read voltage generation circuit 75 generates a read voltage Vrea by controlling the latch and control circuits 17, 27. The voltages Vpgm, Vera, and Vrea generated from the voltage generation circuits 71, 72, 73 are transferred to the row decoders 13, 23 through switching means, and are finally transferred to a word line WL selected by the row decoders 13, 23. To provide a fast operation speed, the read voltage generation circuit 75 utilizes a boosting circuit.

Referring to FIG. 5, the conventional read voltage generation circuit 75 comprises a switch S1 connected between an input terminal and two capacitors C1, CL. A precharge circuit 75a is also provided. When the precharge circuit 75a precharges a node N1 up to a power supply voltage VCC level, a boosting operation of the read voltage generation circuit (or boosting circuit) 75 starts. More specifically, when the node N1 is precharged to the power supply voltage VCC, a voltage level of the switch S1 input terminal transitions from a ground voltage VSS to the power supply voltage VCC and the switch S1 is turned on. When the power supply voltage VCC is transferred to the capacitor C1 through the switch S1, the voltage level of the node N1 is then boosted up to a predetermined level using the coupling effect of the capacitor C1. A boosted voltage (i.e., read voltage Vrea) charged to the node N1 is then transferred to a word line WL through the row decoders 13, 23 (see FIG. 3).

As noted previously, the trend in semiconductor memory devices is toward lower operating voltage levels. In fact, current NOR-type flash memory devices are operated using extremely low voltage levels (e.g., approximately 2V, 1.7V, or less). Therefore, using the boosting circuit 75 constructed as shown in FIG. 5, it is difficult to obtain a sufficient voltage level for the read voltage Vrea that is required for conducting a read operation of a memory cell. For example, assuming that the NOR flash memory device is operated using an operating voltage of 1.7V, generating a boosted voltage of 3.5V or more for the read voltage Vrea is difficult using the read voltage generation circuit 75. This is because a boosting efficiency of about 200% or more is required.

Reducing an erased threshold voltage distribution of a memory cell and/or increasing the size of the boosting capacitor have been studied and suggested as ways of solving this problem. Unfortunately, lower erased threshold voltages may result in a program/read failure caused by a drain turn-on phenomenon. And increasing the size of the boosting capacitor results in an increase in chip size. Accordingly, the implementation of these proposed methods includes a number of drawbacks.

SUMMARY OF THE INVENTION

Various embodiments of the present invention provide a boosting circuit that is able to quickly produce a boosted voltage level sufficient to operate a semiconductor memory device with a low operating voltage.

Various embodiments of the invention provide a boosting circuit that uses a low operating voltage to generate a boosted voltage sufficient to operate a semiconductor memory device while reducing an increase in area of the semiconductor memory device.

According to one aspect of the invention, a boosting unit is configured to generate a boosted voltage having a voltage level higher than a power supply voltage level. The boosting unit preferably comprises a plurality of boosting circuits connected in series. Each of the boosting circuits boosts up an input voltage in response to a boosting signal, and outputs an output voltage having a voltage level higher than that of the input voltage. Each of the boosting circuits is also provided with a corresponding enabling/disabling boosting signal. Each of the boosting circuits includes a precharge circuit, a capacitor circuit, and a switching circuit.

The precharge circuit charges a corresponding output terminal of the boosting circuit in response to a precharge signal. The capacitor circuit comprises a boosting capacitor, and has a first electrode (or terminal) and a second electrode (or terminal). The first electrode is connected to the corresponding switching circuit. The second electrode is connected to the output terminal of the corresponding precharge circuit. The switching circuit comprises a first switching transistor connected between a first power supply voltage and the first electrode of the boosting capacitor and is switched by the corresponding boosting signal. A second switching transistor is connected between a second power supply voltage and the first electrode of the boosting capacitor and is switched by the corresponding boosting signal. The switching circuit responds to a corresponding boosting signal to charge/discharge the capacitor circuit by connecting the capacitor circuit to a first or a second power supply voltage.

Alternatively, the capacitor circuit can include a first electrode connected to the corresponding switching circuit, a second electrode connected to an output terminal of the corresponding boosting circuit, and a plurality of boosting capacitors that are connected to each other in parallel. The switching circuit can include a plurality of first-type switching transistors connected between the first power supply voltage and the corresponding second voltage of the boosting capacitor. The first-type switching transistors are switched by the corresponding boosting signal. A plurality of second-type switching transistors are connected between the second power supply voltage and the corresponding first electrode of the boosting capacitor and are switched by the corresponding boosting signal.

The boosting circuit of a final terminal can include all of the components of the other boosting circuit(s) and further comprise a boosting control circuit to control a boosting efficiency of a finally outputted boosted voltage in response to a plurality of boosting selection signals. The boosting control circuit includes a current path formed between the corresponding first switch transistor and the corresponding second switch transistor, and a plurality of third switch transistors having a gate controlled by the corresponding boosting selection signal.

According to another embodiment of the invention, a boosting unit for generating a boosted voltage higher than a power supply voltage comprises a first switching circuit, a first boosting circuit, a first precharge circuit, a second switching circuit, a second boosting circuit, and a second precharge circuit. The first switching circuit selectively transfers a power supply voltage or a ground voltage in response to a first boosting signal from the outside. The first boosting circuit has a first terminal connected to an output terminal of the first switching circuit. The first precharge circuit precharges a second terminal of the first switching circuit to the power supply voltage level.

The second switching circuit selectively transfers either an output voltage or the ground voltage from the second terminal of the first boosting circuit in response to a second boosting signal. The second boosting circuit has a first terminal connected to an output terminal of the second switching circuit. The second precharge circuit precharges a second terminal of the second boosting circuit to the power supply voltage level. The first and the second boosting circuits simultaneously carry out a boosting operation in response to the first and the second boosting signals.

According to a further embodiment of the invention, a boosting unit for generating a boosted voltage having a voltage level higher than a power supply voltage comprises a plurality of boosting circuits, and a boosting control circuit for generating a plurality of boosting control signals. Each of the boosting circuits boosts up an input voltage in response to a corresponding one of a plurality of simultaneously enabled and disabled boosting signals. The boosting circuits output a plurality of output voltages, each having a voltage level higher than that of its input voltage. The boosting control signals control a final boosting circuit in response to a corresponding boosting signal and externally applied row addresses. The final boosting circuit selectively outputs a boosted voltage through an output terminal corresponding to the row addresses, in response to the boosting control signals.

Each of the boosting circuits preferably includes a precharge circuit, a capacitor circuit, and a switching circuit. The precharge circuit charges an output terminal of the corresponding boosting circuit with the precharge voltage in response to a precharge signal. The capacitor circuit is connected to the output terminal of the precharge circuit. The switching circuit connects the capacitor circuit to a first or a second power supply voltage to charge/discharge the capacitor circuit in response to the corresponding boosting signal.

In addition to these components, the boosting circuit of the final terminal further comprises a boosting control unit which controls boosting efficiency of a finally outputted boosted voltage in response to a plurality of boosting selection signals. The boosting control unit includes a plurality of boosting control circuits that output the boosting control signals in response to the boosting signal and the corresponding one of the row addresses. Each of the boosting control circuits includes a NAND gate that NANDs the boosting signal with a corresponding row address to generate an output signal, and a level shifter that supplies the boosted voltage to a corresponding boosting circuit in response to an output signal from the NAND gate.

The capacitor circuit comprises a first electrode (or terminal) of a boosting capacitor connected to the corresponding switching circuit, and a second electrode (or terminal) connected to an output terminal of the corresponding boosting circuit. The switching circuit comprises a first switching transistor which is connected between the first power supply voltage and the first electrode of the boosting capacitor and is switched by the corresponding boosting signal. A second switching transistor is connected between the second power supply voltage and the first electrode of the boosting capacitor and is switched by the corresponding boosting signal.

Alternatively, the capacitor circuit may comprise a plurality of boosting capacitors are connected in parallel between a first electrode and a second electrode of the capacitor circuit. The first electrode of the capacitor circuit is connected to the switching circuit. The second electrode is connected to an output terminal of the corresponding boosting circuit. The switching circuit comprises a plurality of first-type switching transistors that are connected between the first power supply voltage and the corresponding electrode of the boosting capacitor and are switched by the corresponding boosting signal. A plurality of second-type switching transistors are connected between the second power supply voltage and the corresponding first electrode of the boosting capacitor and are switched by the corresponding boosting signal.

Boosting circuits connected in series carry out a boosting operation at the same time, thereby generating a boosted voltage that is boosted up with the required boosting efficiency at a high speed. The final boosting circuit selectively outputs a boosted voltage through an output terminal corresponding to a row address, thereby preventing boosting efficiency from degrading as a result of the capacitance of an output terminal. This also minimizes any increase in the area of a boosting circuit.

BRIEF DESCRIPTION OF THE DRAWINGS

A more complete understanding of the present invention may be acquired through the following Detailed Description of Preferred Embodiments, made with reference to the accompanying figures, in which like reference numbers indicate like features and wherein:

FIGS. 8A and 8B provide a detailed circuit diagram of the boosting unit of FIG. 6, wherein;

FIG. 8A is a detailed circuit diagram of a first boosting circuit of the boosting unit of FIG. 6; and FIG. 8B is a detailed circuit diagram of a final boosting circuit of the boosting unit of FIG. 6;

FIGS. 13A and 13B are operation timing diagrams illustrating the operation of a boosting unit in accordance with various embodiments of the invention, wherein;

FIG. 13A is an operation timing diagram illustrating the operation of a boosting unit when a single address is received; and FIG. 13B is an operation timing diagram illustrating the operation of a boosting unit when two addresses are received;

DETAILED DESCRIPTION OF PREFERRED EMBODIMENTS

Referring to FIGS. 6, 7, and 8A–B, a boosting unit 750 according to an embodiment of the invention includes a plurality of boosting circuits BOOST1, BOOST2, ..., BOOSTn-1, BOOSTn (where n is a positive integer) connected together in series. Each of these circuits simultaneously carries out a boosting operation, thereby quickly enabling a boosted voltage Vrea having the required voltage level.

Figure 1:
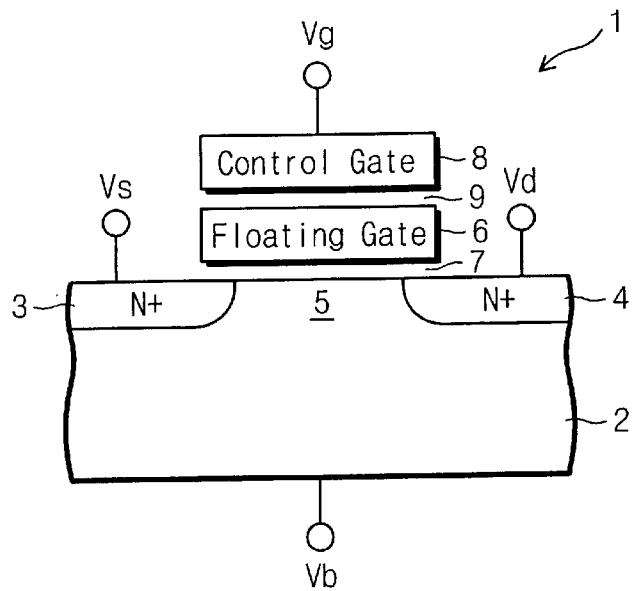
FIG. 1 is a schematic cross-sectional view of a conventional flash memory cell, showing an internal structure thereof.
Figure 2:
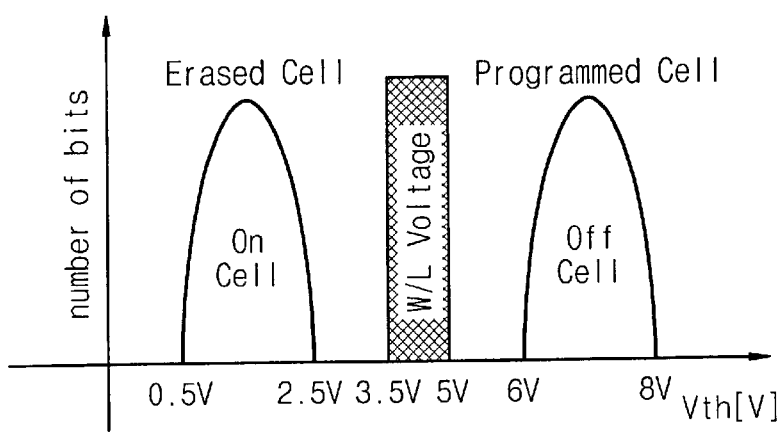
FIG. 2 is a threshold voltage distribution graph showing threshold voltage distribution profiles of conventional memory cells, like that shown in FIG. 1, corresponding to erase and program operations.
Figure 3:
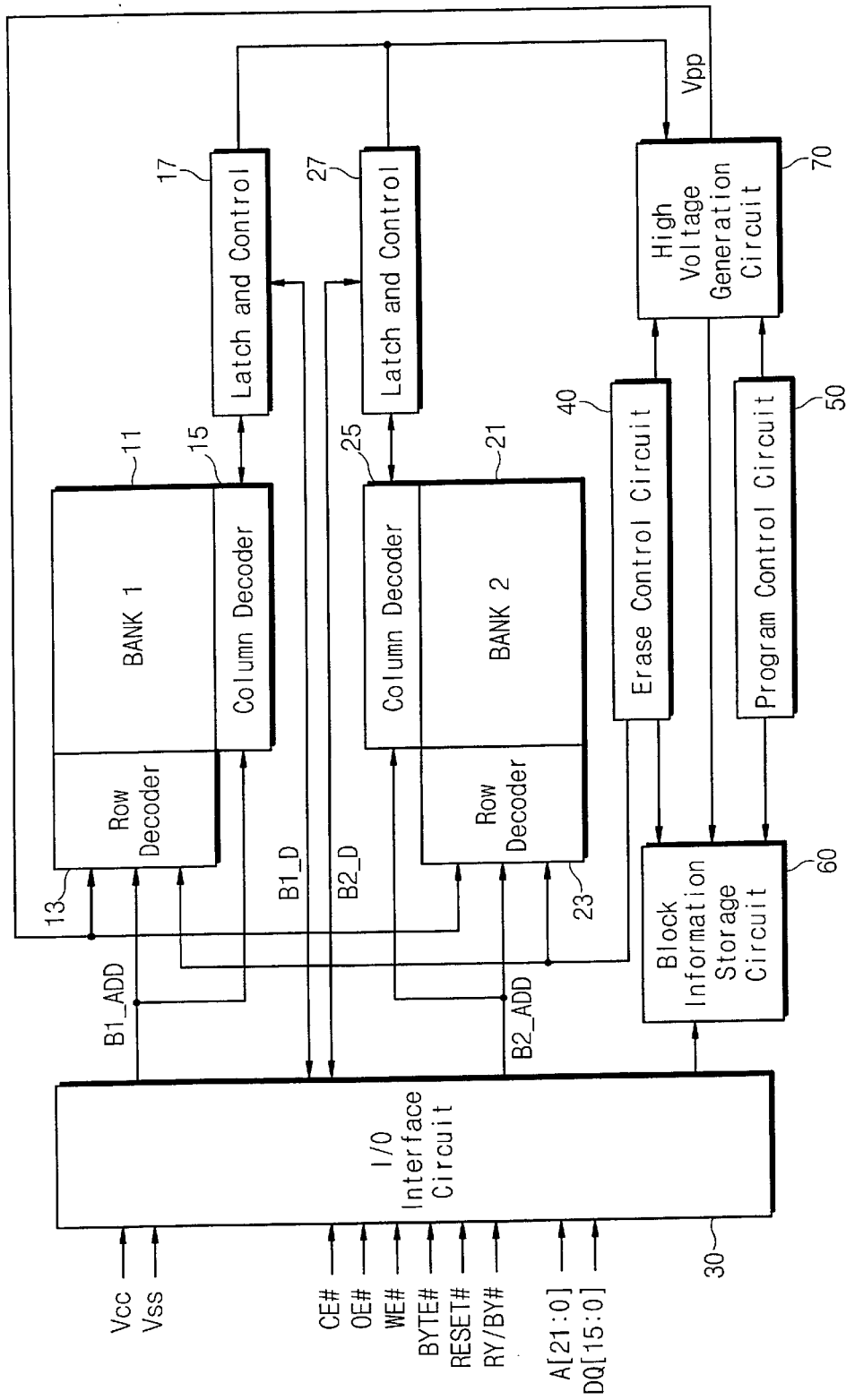
FIG. 3 is a schematic block diagram showing a conventional NOR-type multi-bank flash memory device.
Figure 4:
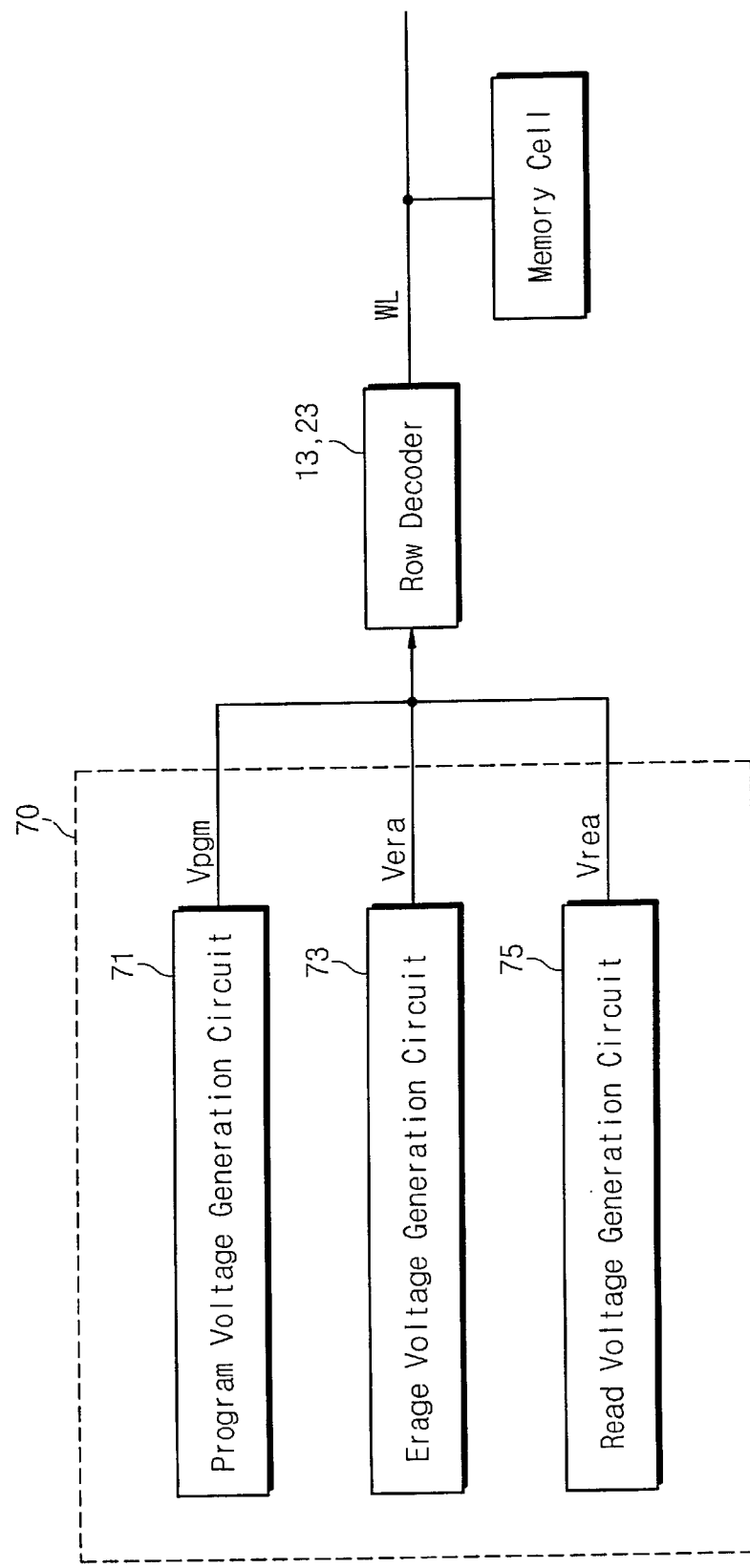
FIG. 4 is a schematic block diagram showing a high voltage generation circuit and a row decoder arrangement according to the prior art.
Figure 5:
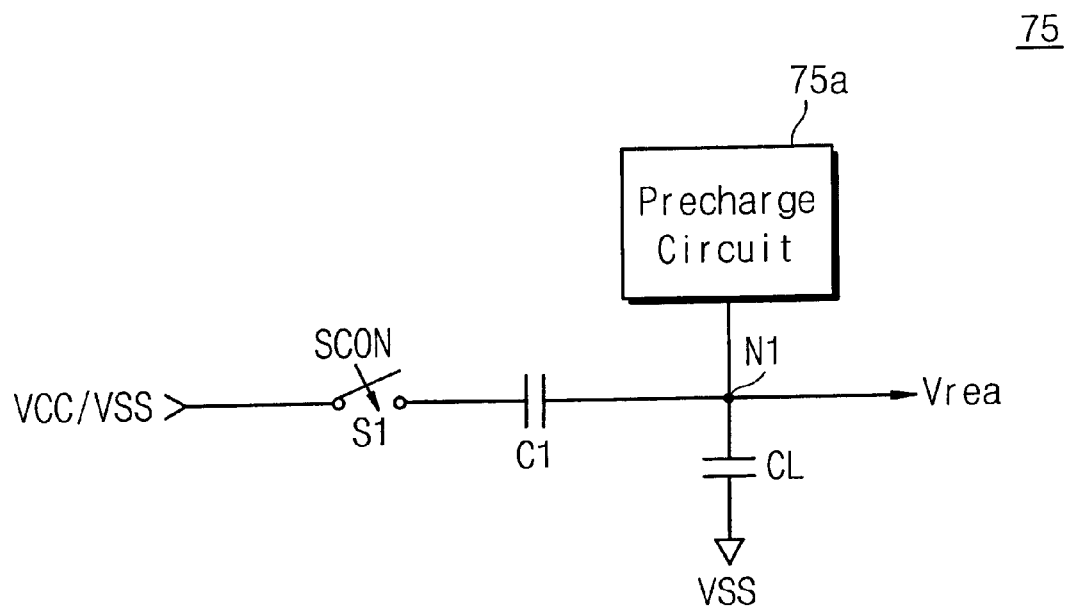
FIG. 5 is a schematic circuit diagram illustrating a conventional boosting circuit.
Figure 6:
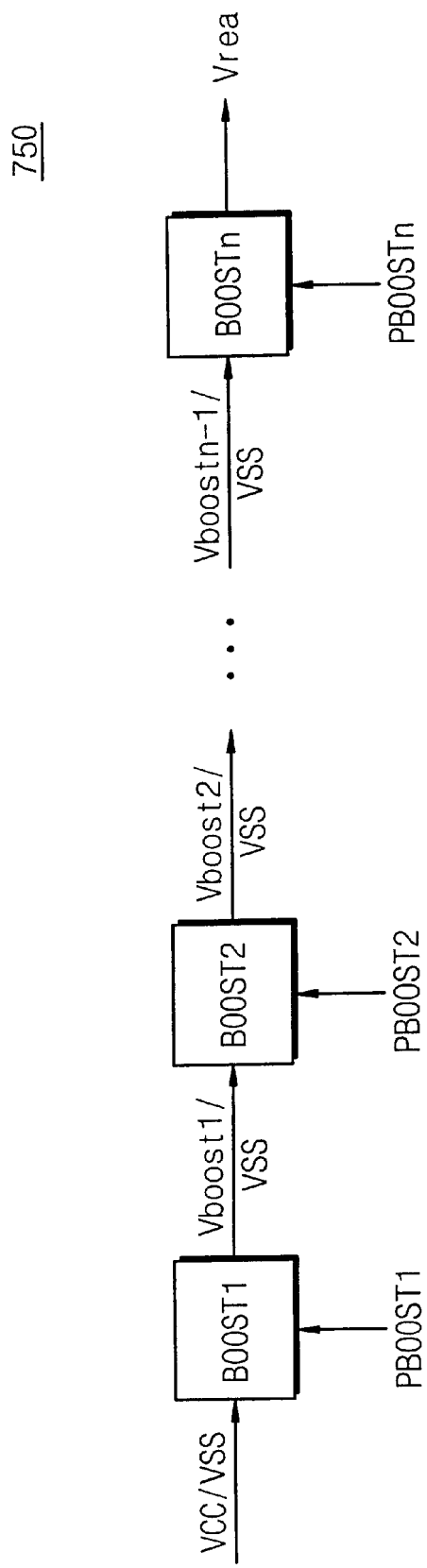
FIG. 6 is a schematic block diagram of a boosting unit of a semiconductor memory device in accordance with an embodiment of the invention.

Referring specifically to FIG. 6, each of the plurality of series connected boosting circuits BOOST1–BOOSTn selectively receives either a ground voltage VSS or a positive input voltage. The positive input voltage can, for instance, be a power supply voltage VCC or a boosted voltage Vboost1, Vboost2, ..., Vboostn-2, or Vboostn-1 from a preceding boosting circuit. Each of the boosting circuits outputs a boosted voltage Vboost1, Vboost2, ..., Vboostn-1, or Vera, having a predetermined voltage level higher than its input voltage, in response to a corresponding boosting signal PBOOST1, PBOOST2, ..., PBOOSTn-1, or PBOOSTn.

Figure 7:
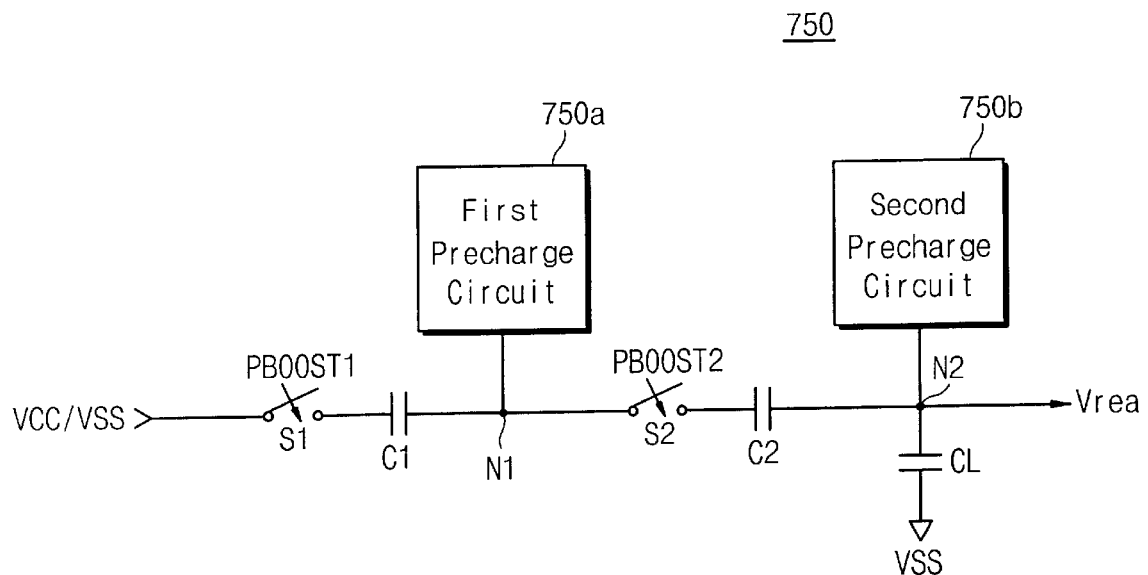
FIG. 7 is a schematic circuit diagram of the boosting unit of FIG. 6.

Referring now to FIG. 7, the boosting unit 750 generates a boosted read voltage Vrea, having a predetermined voltage level (e.g., 3.4V~5V) higher than a power supply voltage VCC level, using a plurality of capacitors C1, C2, CL, and a switch S1. Charge relations between a first capacitor C1 and a second capacitor C2, and between the second capacitor C2 and a latch capacitor CL are used to enhance boosting efficiency. The following equations (wherein V1 is the voltage of node N1 and V2 is the voltage of node N2) explain the charge relationship between the capacitors.

$$C1(VCC-0)+C2(0-VCC)=C1(V1-VCC)+C2(V1-V2)$$

$$C2(VCC-0)+CL(VCC-0)=C2(V2-V1)+CL(V2-0)$$

Using the foregoing equations, a voltage level of a final boosted voltage Vrea can be calculated.

Figures 8, 8A:
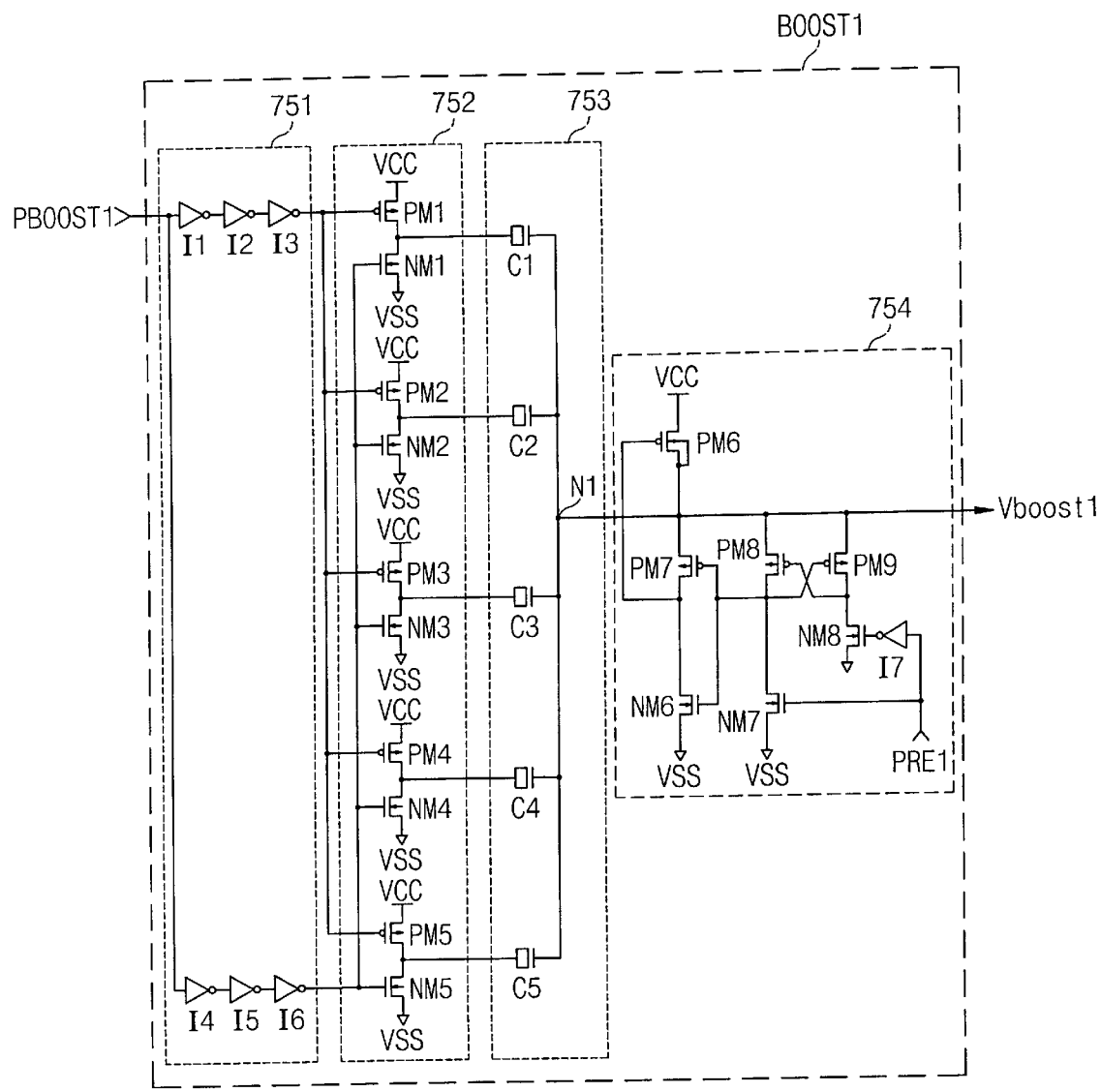
Figure 8B:
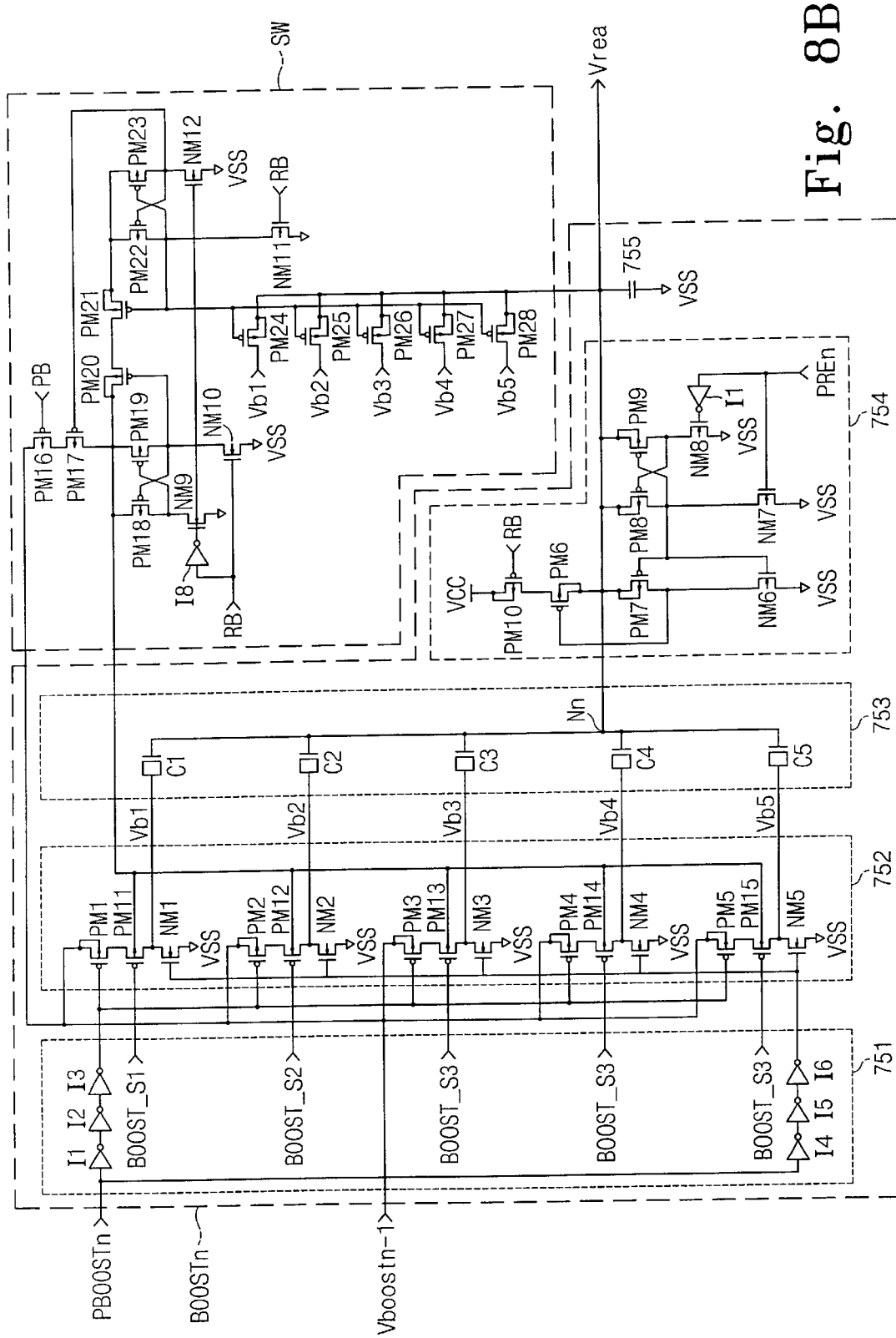

Referring now specifically to FIGS. 8A and 8B, each of the boosting circuits BOOST1–BOOSTn includes an input driving circuit 751, a switch circuit 752, a capacitor circuit 753, and a precharge circuit 754. Each input driving circuit 751 drives a corresponding one of a plurality of external boosting signals PBOOST1, PBOOST2, ..., PBOOSTn-1, or PBOOSTn. Each switch circuit 752 selectively transfers either a ground voltage VSS or a positive voltage to the corresponding capacitor circuit 753 using the boosting signal PBOOST1, PBOOST2,..., PBOOSTn-1, or PBOOSTn from its corresponding input driving circuit 751. The positive voltage can, for instance, be a boosted voltage Vboost1, Vboost2, ..., Vboostn-2, or Vboostn-1 from a previous boosting circuit BOOST1, BOOST2, ..., BOOSTn-2, or BOOSTn-1 (if any) or a power supply voltage VCC (in the case of the first boosting circuit BOOST1).

Each precharge circuit 754 precharges a boosting node N1, N2, ..., Nn-1, or Nn of the boosting circuit to the power supply voltage VCC level. The related capacitor circuit 753 then boosts up its respective boosting node N1, N2, ..., Nn-1, or Nn to a predetermined voltage level higher than the power supply voltage VCC level.

The specific construction and operation of a preferred embodiment of each these circuits will now be described in further detail. The construction and operation of each of the boosting circuits BOOST1–BOOSTn-1 other than the final boosting circuit BOOSTn is similar and will be described with reference to FIG. 8A. Referring to FIG. 8A, an input driving circuit 751 preferably includes a first and a second group of inverters I1, I2, I3 and I4, I5, I6, respectively. The inverters I1–I3 of the first group are connected in series between the boosting signal input terminal PBOOST1 and gates of five PMOS transistors PM1, PM2, PM3, PM4, PM5 of the switch circuit 752. The inverters I4–I6 of the second group are connected between the boosting signal input terminal PBOOST1 and gates of five NMOS transistors NM1, NM2, NM3, NM4, NM5 of the switch circuit 752.

As noted above, the switch circuit 752 of each of the boosting circuits BOOST1–BOOSTn-1, other than the final boosting circuit BOOSTn, includes five PMOS transistors PM1–PM5, and five NMOS transistors NM1–NM5. Each PMOS transistor PM1–PM5 has a current path formed between a power supply voltage VCC or a previous boosting circuit output terminal and a corresponding NMOS transistor NM1, NM2, NM3, NM4, or NM5. Each of the PMOS transistors PM1–PM5 also has a gate connected to an output terminal of the third inverter I3 of the input driving circuit 751. Each NMOS transistor NM1–NM5 has a current path formed between its corresponding PMOS transistor PM1, PM2, PM3, PM4, or PM5 and a ground voltage VSS. Each of the NMOS transistors NM1–NM5 also has a gate connected to the output terminal of the sixth inverter I6 of the input driving circuit 751.

The capacitor circuit 753 includes five capacitors C1, C2, C3, C4, C5, each of which has one terminal connected between a corresponding MOS transistor pair PM1 and NM1, PM2 and NM2, PM3 and NM3, PM4 and NM4, or PM5 and NM5, respectively, of the switch circuit 752. A second terminal of each of the capacitors C1–C5 is connected to a corresponding boosting node (i.e., N1 in BOOST1, N2 in BOOST2, ..., Nn-1 in BOOSTn-1).

The precharge circuit 754 also includes a plurality of PMOS and NMOS transistors PM6, PM7, PM8, PM9, NM6, NM7 and an inverter I7. A sixth PMOS transistor PM6 has a current path formed between a power supply voltage VCC and a corresponding boosting node N1, N2, ..., or Nn-1. A gate of the sixth PMOS transistor PM6 is connected to a drain of the seventh PMOS transistor PM7. The seventh PMOS transistor PM7 has a current path formed between the boosting node and the sixth NMOS transistor NM6. A gate of the seventh PMOS transistor PM7 is connected to a drain of the eighth PMOS transistor PM8. The eighth PMOS transistor PM8 has a current path formed between the boosting node and the seventh NMOS transistor NM7. A gate of the eighth PMOS transistor PM8 is connected to a drain of the ninth PMOS transistor PM9.

The ninth PMOS transistor PM9 has a current path formed between the boosting node N1, N2, ..., or Nn-1 and the eighth NMOS transistor NM8. A gate of the ninth PMOS transistor PM9 is connected to a drain of the eighth PMOS transistor PM8. The sixth NMOS transistor NM6 has a current path formed between the seventh PMOS transistor PM7 and a ground voltage VSS. A gate of the sixth NMOS transistor NM6 is connected to a drain of the eighth PMOS transistor PM8. The seventh NMOS transistor NM7 has a current path formed between the eighth PMOS transistor PM8 and a ground voltage VSS. A gate of the seventh NMOS transistor NM7 is controlled by a precharge signal PRE. The eighth NMOS transistor NM8 has a current path formed between the ninth PMOS transistor PM9 and a ground voltage VSS. An input terminal of an inverter 17 receives the precharge signal PRE, and an output terminal of the inverter 17 is connected to a gate of the eighth NMOS transistor NM8.

Referring to FIG. 8B, unlike the previously described boosting circuits BOOST1–BOOSTn–1, the final boosting circuit BOOSTn, connected to the last terminal, includes a boosting control circuit in the switching circuit 752, a supplemental switch circuit SW, and a boosting capacitor 755. The boosting control circuit provides additional PMOS transistors PM11, PM12, PM13, PM14, PM15 to the switch circuit 752. Each of these additional PMOS transistors PM11–PM15 includes a current path and a control gate. The current path of each of the control circuit PMOS transistors PM11–PM15 is formed between a corresponding PMOS and NMOS transistor pair PM1 and NM1, PM2 and NM2, PM3 and NM3, PM4 and NM4, or PM5 and NM5, respectively. Each of the control gates is controlled by one of the boosting selection signals BOOST_S1, BOOST_S2, or BOOST_S3.

In order to prevent reverse boosting from stopping or interfering with the boosting operation, a supplemental switch circuit SW is connected to an output terminal of the boosting circuit BOOSTn. The supplemental switch circuit SW includes a plurality of MOS transistors PM16, PM17, . . . , PM27, PM28, NM9, NM10, NM11, NM12 and an inverter 18. The boosting capacitor 755 is connected between the output terminal of the supplemental switch circuit SW and a ground voltage VSS.

Operation of a boosting unit 750 according to a first embodiment of the invention will now be described more fully with reference to FIGS. 6–8B, and FIGS. 13A–B. Referring to FIGS. 6–8B and 13A–B, a boosting unit 750 has a plurality of simultaneously enabled boosting circuits BOOST1–BOOSTn connected together in series to carry out a boosting operation at the same time. In this manner, the boosting unit 750 generates the required boosted voltage Vrea at high speed.

The boosting unit 750, when used in a semiconductor memory device such as a Dynamic Random Access Memory (DRAM) device or a NOR-type flash memory device, generates a read voltage Vrea for a read operation. As mentioned above, since the read voltage Vrea for a semiconductor memory device must have a predetermined voltage level (e.g., 3.5V–5V) and be outputted quickly, a boosting circuit according to the invention is particularly desirable. In particular, a NOR-type flash memory device operated using a low operating voltage (e.g., 1.7V or 2.0V or less) will benefit from this invention.

The first boosting circuit BOOST1 in the boosting unit 750 generates a first boosted voltage Vboost1 using a first precharge signal PRE1 and an externally supplied first boosting signal PBOOST1. More specifically, when the first precharge signal PRE1 and the first boosting signal PBOOST1 are at a low level, an output terminal N1 of the first boosting circuit BOOST1 is precharged to a power supply voltage VCC level. At the same time, one of the terminals of each of the capacitors C1–C5 of the capacitor circuit 753 is discharged to a ground voltage VSS level by the NMOS transistors NM1–NM5 of the switch circuit 752.

Figure 13A:
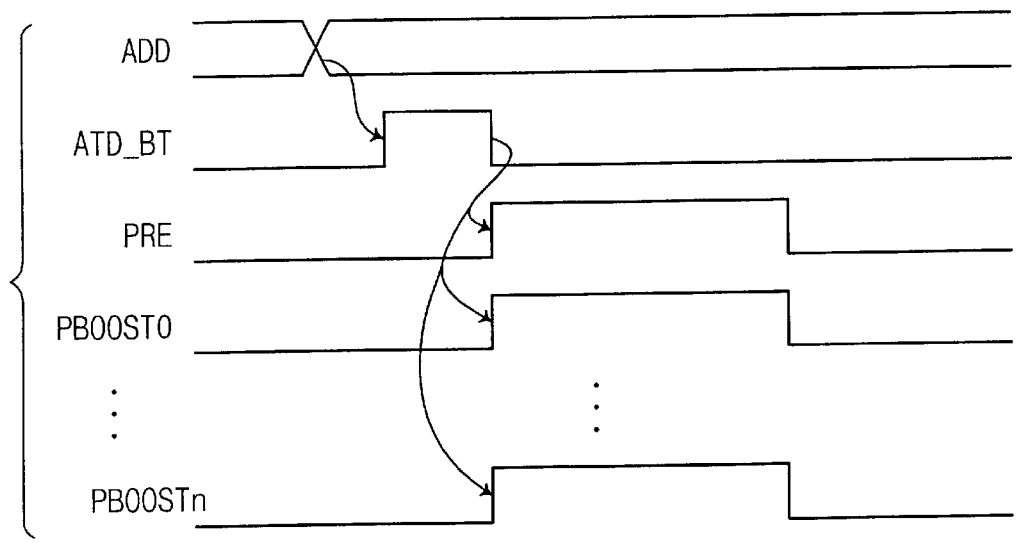

An external address signal ADD is inputted into a memory device to select a memory cell for performing a read operation. Referring specifically to FIG. 13A, if an external address transition signal ATD_BT transitions to a high level and then to a low level, the first precharge signal PRE1 and the first boosting signal PBOOST1 transition to a high level. Thus, the precharge operation of the precharge circuit 754 is completed and a boosting operation of the first boosting circuit BOOST1 is performed. If the first boosting signal PBOOST1 is enabled to a high level, the inverters I1–6 of an input driver 751 invert the first boosting signal PBOOST1 and then transfer the inverted first boosting signal/PBOOST1 to the gates of the MOS transistors PM1–PM5, NM1–NM5.

In this state, the current paths of the PMOS transistors PM1–PM5 are conducted, while those of the NMOS transistors NM1–NM5 are interrupted. When the current path of the PMOS transistors PM1–PM5 are conducted, the voltage level of a terminal of each of the capacitors C1–C5 transitions from a ground voltage VSS to a power supply voltage VCC as a result of charges transmitted through the current paths of the PMOS transistors PM1–PM5. A voltage level of the first boosting node N1, connected to second terminals of each of the capacitors C1–C5, is thereby boosted up above a power supply voltage VCC level to a first boosted voltage Vboost1 level by a capacitor coupling effect. The first boosted voltage Vboost1 outputted from the first boosting circuit BOOST1 is transferred to a second boosting circuit BOOST2 of the next terminal.

The subsequent boosting circuits BOOST2, BOOST3, . . . , BOOSTn–1, in turn generate boosted voltages Vboost2, Vboost3, . . . , Vboostn–1, respectively, for boosting subsequent boosted voltages Vboost3, . . . , Vboostn–1, and Vrea from the boosting circuits BOOST3, . . . , BOOSTn–1, BOOSTn, respectively, of the remaining terminals. This is done under the control of the external boosting signals PBOOST2, PBOOST3, . . . , PBOOSTn–1, PBOOSTn and precharge signals PRE2, PRE3, . . . , PREn–1, PREn, corresponding to the subsequent boosting circuits BOOST2, BOOST3, . . . , BOOSTn, respectively. As shown in FIG. 13A the second through nth precharge signals PRE2, PRE3, . . . , PREn–1, PREn are simultaneously enabled/disabled together with the first precharge signal PRE1. Likewise, the second through nth boosting signals PBOOST2, PBOOST3, . . . , PBOOSTn–1, PBOOSTn are simultaneously disabled/enabled together with the first boosting signal PBOOST1. Because all of the boosting circuits are controlled by simultaneously disabled/enabled control signals, the boosting circuits carry out their boosting operations in unison. This causes the boosted voltages Vboost1, Vboost2, . . . , Vboostn–1, and Vrea to be boosted and outputted at high speed (i.e., in about 78 nanoseconds).

Figure 13B:
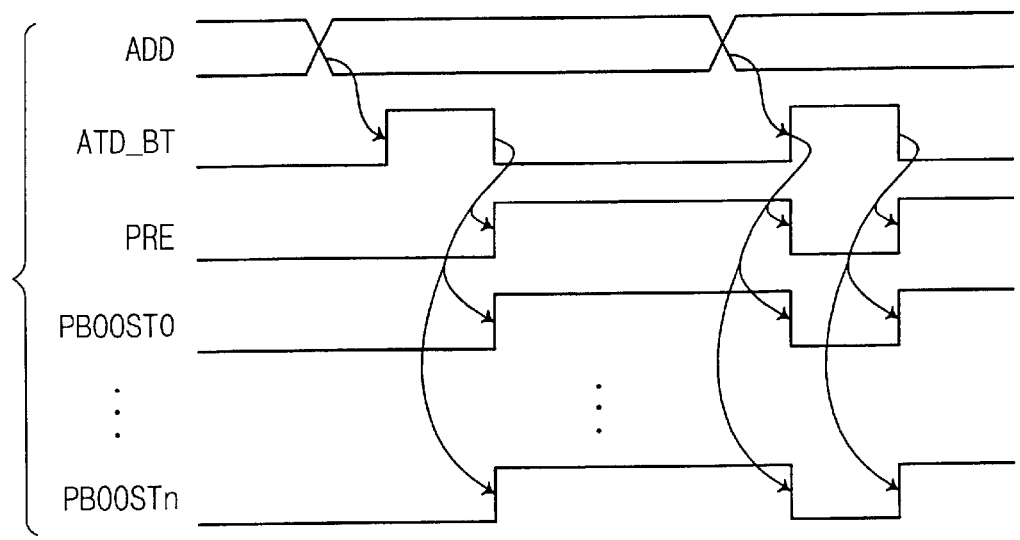
Figure 14:
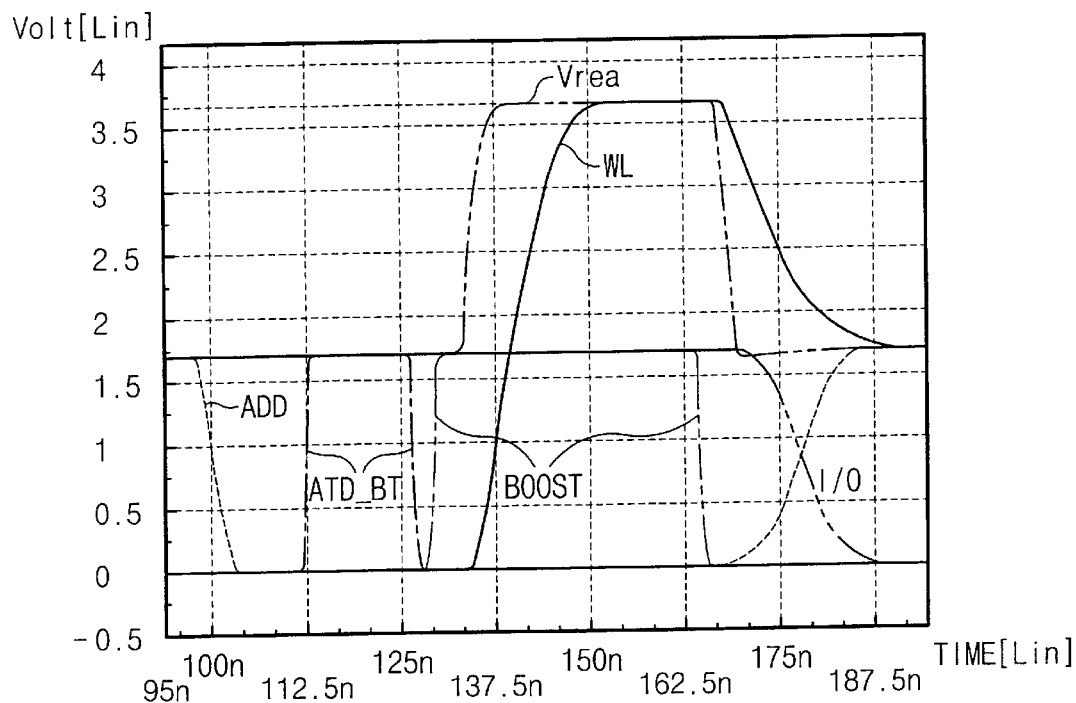
FIG. 14 is a waveform diagram showing input/output signals of a boosting circuit constructed in accordance with an embodiment of the invention.

As shown in FIG. 13A, the boosting signals PBOOST1–PBOOSTn are enabled at a low transition interval of the address transition detection signal ATD_BT. The precharge signals PRE1–PREn are disabled at that time. The address transition detection signal ATD_T is enabled when an address ADD is externally inputted to vary a state thereof. Referring to FIG. 13B, if a second address is inputted before completion of a read operation for the first address, the address transition detection signal ATD_BT is enabled again. The boosting signals PBOOST1–PBOOSTn are disabled when the transition detection signal ATD_T is enabled and then enabled again at the low transition interval of the address transition detection signal ATD_BT. The precharge signals PRE1–PREn are enabled again while the address transition detection signal ATD_BT is enabled. The boosting signals PBOOST1–PBOOSTn will therefore generate a read voltage Vrea for supplying to a word line WL corresponding to the second address, as well as the first address.

Figure 9:
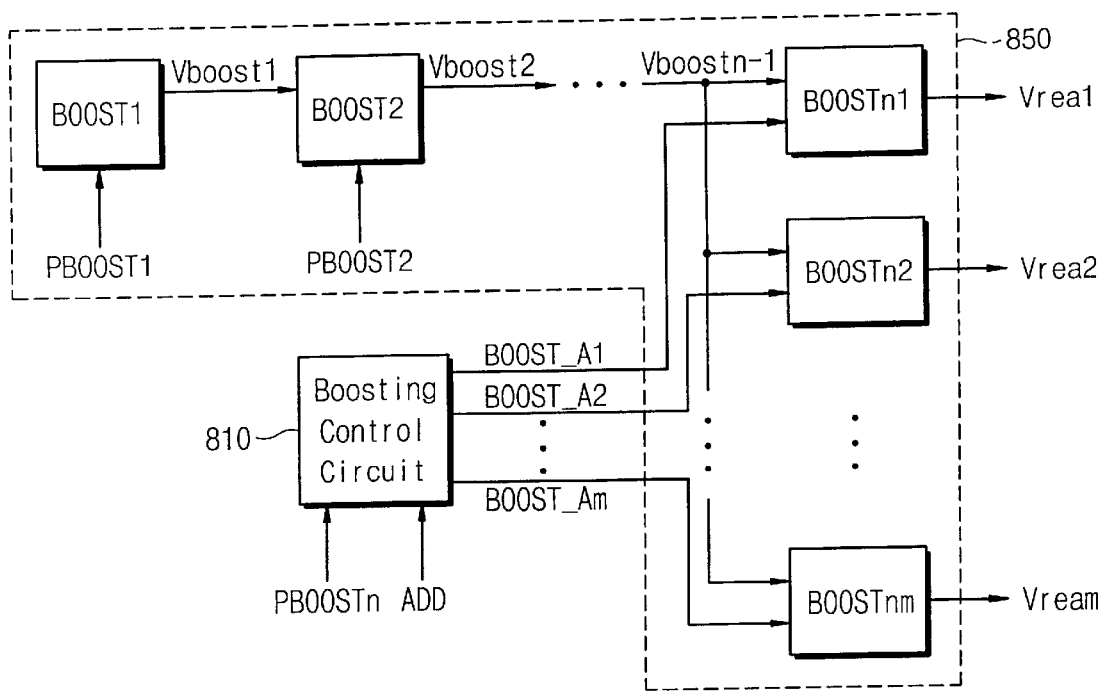
FIG. 9 is a schematic block diagram of a boosting unit of a semiconductor memory device according to another embodiment of the invention.

A second embodiment of the invention will now be described with reference to FIGS. 9–12. Referring first to FIG. 9, a semiconductor memory device in accordance with a second embodiment of the invention includes both a boosting control circuit 810 and a boosting unit 850. The boosting control circuit 810 outputs a plurality of boosting control signals BOOST_A1, BOOST_A2, ..., BOOST_An−1, BOOST_An to control a final boosting circuit BOOSTn, connected to the last terminal of the boosting unit 850. These boosting control signals BOOST_A1–BOOST_An are transmitted to the boosting unit 850 in response to the final boosting signal PBOOSTn and an external address signal ADD.

Referring to FIGS. 9–12, similar to the previous embodiment, the boosting unit 850 includes a plurality of preliminary boosting circuits BOOST1, BOOST2, ..., BOOSTn−1, and a final boosting circuit BOOSTn. Each of the preliminary boosting circuits includes a switch circuit 851, a capacitor circuit 852, and a precharge circuit 853. Under control of a corresponding one of the boosting signals PBOOST1, PBOOST2, ..., or PBOOSTn−1, the respective switch circuit 851 transfers either a ground voltage VSS or a positive voltage to the capacitor circuit 852. The positive voltage is either a power supply voltage VCC, in the case of the first boosting circuit BOOST1, or a boosted voltage Vboost1, Vboost2, ..., or Vboostn−2 from the previous boosting circuit in the case of the second through (n−1)th boosting circuits BOOST2–BOOSTn−1, respectively. Each of the output (or boosting) nodes N1–Nn−1 of the preliminary boosting circuits BOOST1–BOOSTn−1 is precharged to a power supply voltage VCC level by the corresponding precharge circuit 853. Each of the capacitor circuits 852 then boosts up the voltage level at its respective boosting node N1, N2, or Nn−1 to a higher predetermined voltage level.

Unlike the preliminary boosting circuits BOOST1–BOOSTn−1, and unlike the final boosting circuit of the previous embodiment, the final boosting circuit BOOSTn of this embodiment includes a plurality of boosters BOOSTn1, BOOSTn2, ..., BOOSTnm to prevent deterioration of boosting efficiency caused by an increase in capacitance of an output terminal. In this way, larger capacitors and their resulting increase in chip size are avoided.

Figure 10:
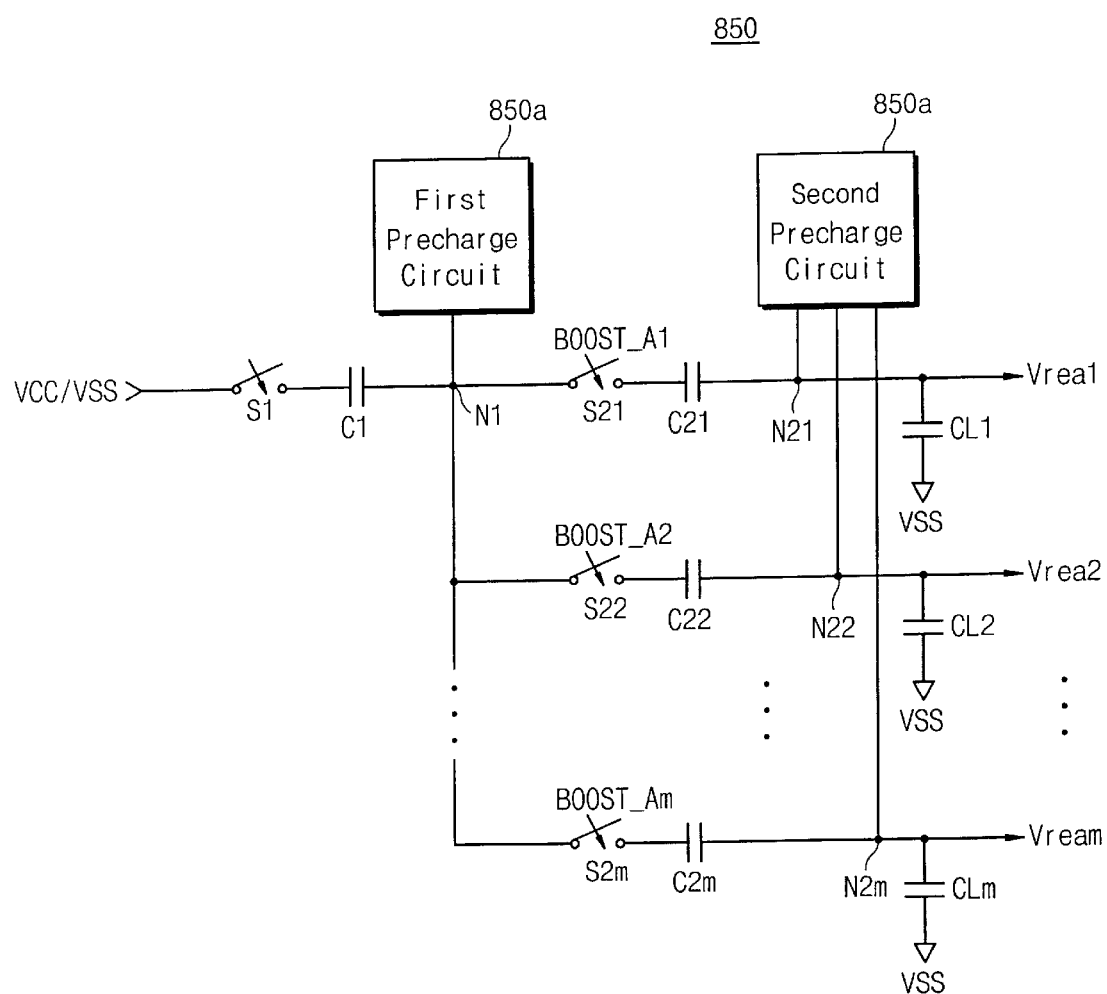
FIG. 10 is a schematic circuit diagram of the boosting unit of FIG. 9.

Referring specifically to FIG. 10, a boosting unit 850 generates a plurality of boosted voltages Vrea1, Vrea2, ..., Vream, each having a predetermined voltage level (i.e., about 3.5V~5V) that is higher than a power supply voltage VCC (e.g., about 2V, 1.7V, or less). The boosting unit 850 includes a first capacitor C1 coupled in series between a first switch S1 and each of a plurality of second switches S21, S22, ..., S2m. Each of a plurality of second capacitors C21, C22, ..., C2m has a first terminal connected to a corresponding one of the second switches S21, S22, ..., or S2m. The boosting unit 850 has a plurality of output terminals N21, N22, ..., N2m, each connected to a second end of a respective second capacitor S21, S22, ..., or S2m.

Each of a plurality of additional capacitors CL1, CL2, ..., CLm is provided between a corresponding one of the output terminals N21, N22, ..., or N23 and a ground voltage VSS. The boosting unit 850 selectively outputs a desired one of the boosted voltages Vrea1, Vrea2, or Vream through a corresponding output terminal during a boosting operation. In this way, the capacitance of an output terminal is reduced to avoid deterioration of the boosting efficiency.

Figure 11:
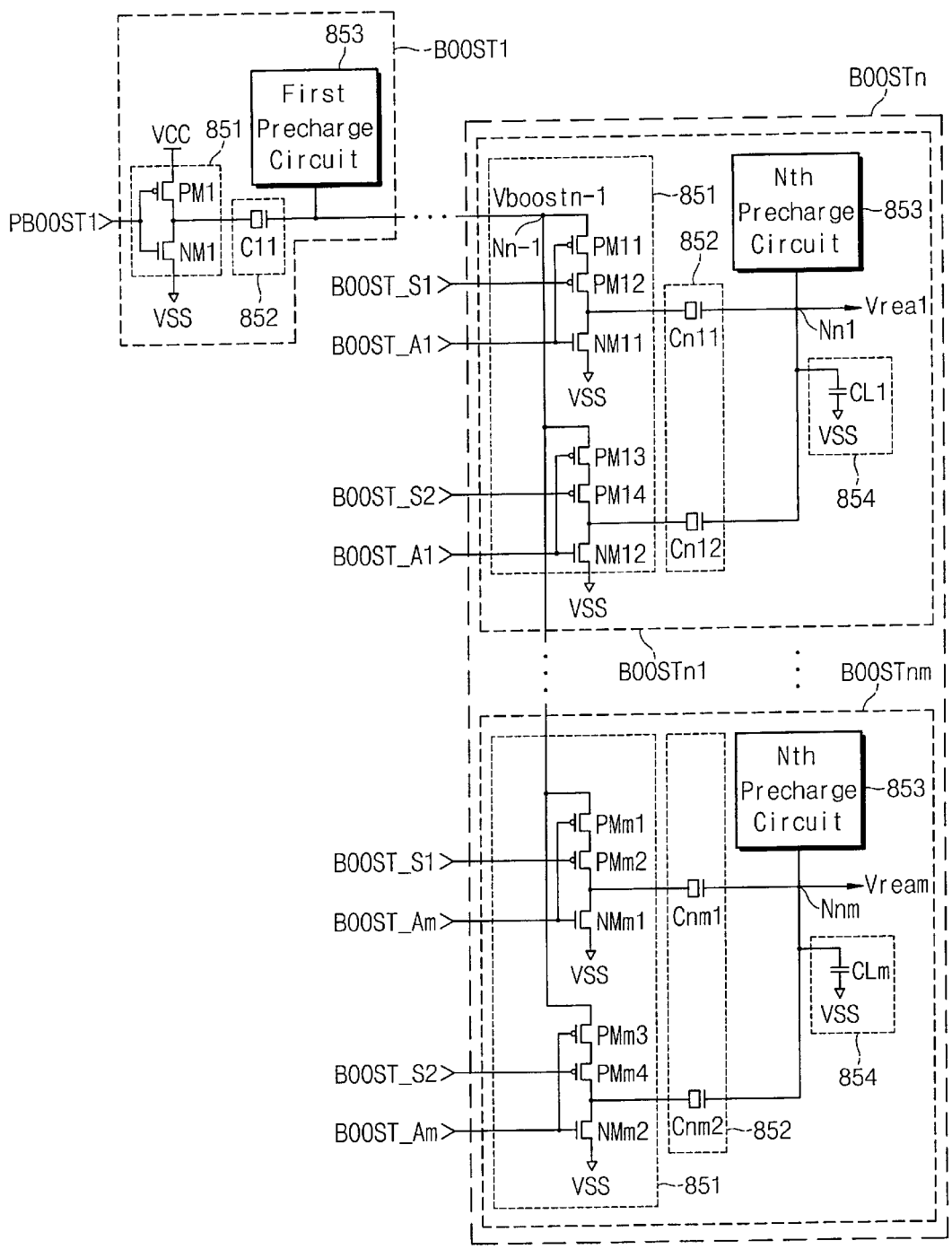
FIG. 11 is a detailed circuit diagram of the boosting unit of FIG. 9.

Referring again to FIGS. 9–11, a boosting unit 850 includes a plurality of boosting circuits BOOST1–BOOSTn. Referring specifically to FIG. 11, a first boosting circuit BOOST1 is representative of each of the preliminary boosting circuits BOOST1–BOOSTn−1. Each of the preliminary boosting circuits includes a switch circuit 851, a capacitor circuit 852, and a precharge circuit 853. Each switch circuit 851 includes two MOS transistors, a PMOS transistor PM1 and an NMOS transistor NM1. The PMOS transistor PM1 has a current path formed between a power supply voltage VCC, in the case of the first boosting circuit BOOST1, or an output terminal of a previous boosting circuit, in the case of the second through (n−1)th boosting circuits BOOST2–BOOSTn−1, and the NMOS transistor NM1. A gate of the PMOS transistor PM1 is controlled by the corresponding boosting signal PBOOST1, PBOOST2, ..., or PBOOSTn−1. The NMOS transistor NM1 has a current path formed between a drain of the PMOS transistor PM1 and a ground voltage VSS. A gate of the NMOS transistor NM1 is controlled by a corresponding one of the boosting signals PBOOST1, PBOOST2, ..., or PBOOSTn−1.

Each capacitor circuit 852 includes a capacitor C11 having two terminals. A first terminal is connected between the PMOS transistor PM1 and the NMOS transistor NM1 of the switch circuit 851. A second terminal is connected to a corresponding output node N1, N2, ..., or Nn−1. The precharge circuit 853 has an output terminal connected to the corresponding output node and hence also to the second capacitor terminal.

As noted previously, unlike the other boosting circuits, the final boosting circuit BOOSTn includes a plurality of boosters BOOSTn1–BOOSTnm. Each of these boosters includes a switch circuit 851, a capacitor circuit 852, a precharge circuit 853, and a load capacitor circuit 854. Using the last booster BOOSTnm as an example, each switch circuit 851 includes four PMOS transistors PMm1, PMm2, PMm3, PMm4 and two NMOS transistors NMm1, NMm2. The current paths of the first two PMOS transistors PMm1, PMm2 and the first NMOS transistor NMm1 are connected in series between the output Vboostn−1 of the previous boosting circuit BOOSTn−1 and a ground voltage VSS. Likewise, the current path of the second two PMOS transistors PMm3, PMm4 and the second NMOS transistor NMm2 are connected in series between the output Vboostn−1 of the previous boosting circuit BOOST n−1 and the ground voltage VSS. A first capacitor Cnm1 of the capacitor circuit 852 of the mth booster BOOSTnm is connected between the second PMOS transistor PMm2 and the first NMOS transistor NMm1. A second capacitor Cnm2 is connected between the fourth PMOS transistor PMm4 and the second NMOS transistor NMm2.

Under the control of the first boosting selection signal BOOST_SI and the mth boosting control signal BOOST_Am, the first and second PMOS transistors PMm1, PMm2, and first NMOS transistor NMm1 selectively transfer a boosted voltage Vboostn−1 from the booster BOOSTn−1 to a corresponding capacitor Cnm1 of the capacitor circuit 852. Under the control of the second boosting selection signal BOOST_S2 and the mth boosting control signal BOOST_Am, the third and fourth PMOS transistors PMm3, PMm4, and second NMOS transistor NMm2 transfer a boosted voltage Vboostn−1 to a corresponding capacitor Cnm2. The two capacitors Cnm1, Cnm2 of the capacitor circuit 852 use a coupling effect to boost up the boosted voltage Vboostn−1 transferred through the switch circuit 851. The precharge circuit 853 precharges the second terminal of each of the two capacitors Cnm1, Cnm2 to a power supply voltage VCC level before the boosted voltage Vboostn−1 is transferred to the first terminal of the capacitors Cnm1, Cnm2 through the switch circuit 851.

Figure 12:
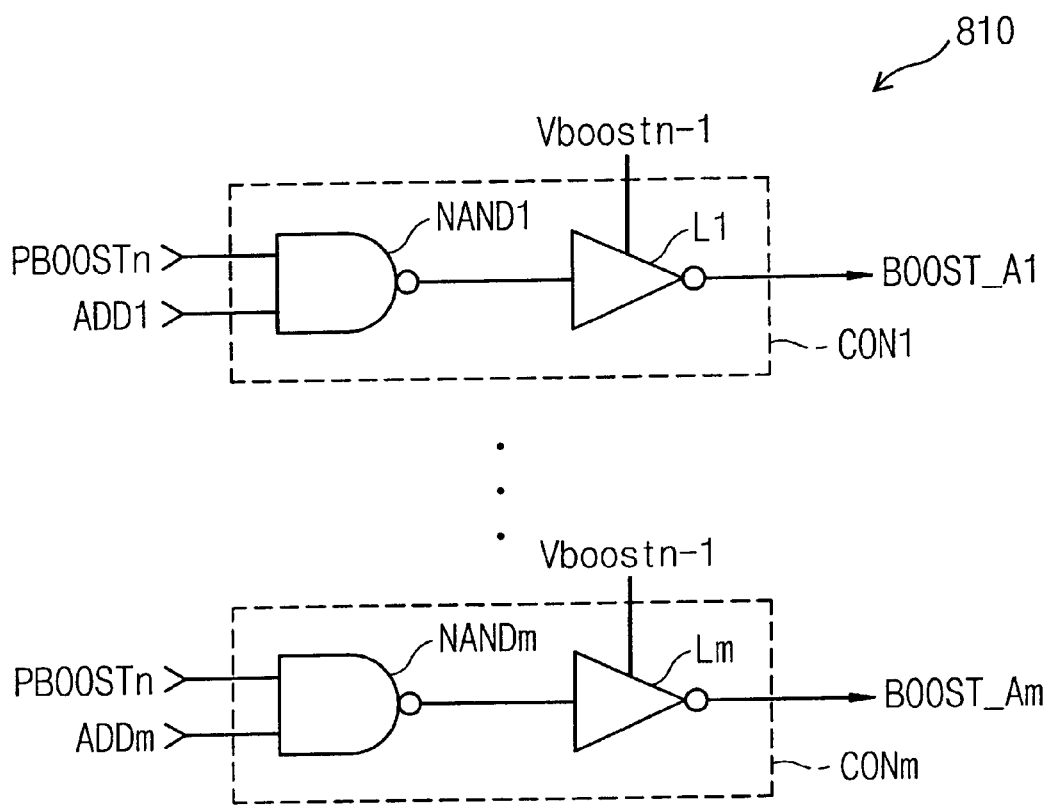
FIG. 12 is a detailed circuit diagram of a boosting control circuit of the boosting unit shown in FIG. 9.

Referring to FIG. 12, the boosting control circuit 810 of FIG. 9 includes a plurality of boosting control circuits CON1, CON2, ..., CONm. Each of the boosting control circuits CON1–CONm includes a NAND gate NAND1, NAND2, ..., or NANDm and a level shifter L1, L2, ..., or Lm, respectively. Each of the NAND gates NAND1–NANDm outputs a signal that combines an external row address signal ADD1 and a final boosting signal PBOOSTn. Each of the level shifters L1–Lm outputs a boosting signal BOOST_A1, BOOST_A2, ..., or BOOST_Am, respectively, having the boosted voltage Vboostn−1 under the control of the respective NAND gate NAND 1, NAND2, ..., or NANDm.

The overall operation of a boosting unit 850 according to this embodiment of the invention will now be described more fully with reference to FIGS. 9–15. Referring to FIGS. 9–15, a boosting unit 850 has a plurality of boosting circuits BOOST1–BOOSTn connected together in series. By simultaneously carrying out a boosting operation in each of the boosting circuits BOOST1–BOOSTn, the boosting unit 850 generates a final boosted voltage Vrea having a sufficient voltage level to enable the performance of a desired operation of a semiconductor memory device. This final boosted voltage Vrea is obtained at a high speed.

The final boosting circuit BOOSTn includes a plurality of boosters BOOSTn1–BOOSTnm, each of which has an output terminal. By selecting a desired one of the output terminals of the boosters, it is possible to prevent deterioration of boosting efficiency caused by increase in capacitance of an output terminal. This thereby minimizes an increase in chip area required by the semiconductor memory device.

Referring to FIGS. 13A and 13B, the boosting operation of each of the preliminary boosting circuits BOOST 1–BOOSTn−1 of the boosting unit 850 of this embodiment is nearly identical to that of the boosting circuits BOOST1–BOOSTn−1 of the earlier described embodiment 750. The distinguishing feature of this embodiment 850 is that it contains plurality of boosters BOOSTn1–BOOSTnm in the final boosting circuit BOOSTn. Under the control of a boosting control signal BOOST_A1, BOOST_A2, ..., or BOOST_Am and a boosting selection signal BOOST_S1, BOOST_S2, or BOOST_S3, the final boosting circuit BOOSTn can selectively output a boosted voltage Vrea1, Vrea2, ..., or Vream to a decoder through one of a plurality of output paths.

For example, assuming that the boosting control signal BOOST_A1 and the boosting selection signal BOOST_S1 are enabled to a low level, only the first booster BOOSTn1 would simultaneously carry out a boosting operation together with the preliminary boosting circuits BOOST1–BOOSTn−1. The eleventh and twelfth PMOS transistors PM11, PM12 of the first booster BOOSTn1 are turned on and the eleventh NMOS transistor NM11 is turned off. Thus, the first terminal of the first capacitor Cn11 of the capacitor circuit 852 is charged to a boosted voltage Vboostn−1 level, and an output node Nn1, which has been precharged to a power supply voltage VCC level is boosted up to a boosted voltage level Vrea1 at high speed. The high-speed boost up of the boosted voltage Vrea1 occurs because the output terminals Nn1–Nm of the boosting unit 850 are separated, respectively, to reduce a value of capacitance applied to each of the nodes Nn1–Nnm. Of course, all the boosters BOOSTn1, BOOSTn2, ..., BOOSTnm−1, BOOSTnm are connected together in parallel, outputting the selected one of the boosted voltages Vrea1, Vrea2, ..., Vream−1, or Vream through a respective one of the output terminals. The layout area of this embodiment 850 is larger than the boosting unit 750 according to the earlier described embodiment.

As mentioned above, the boosting unit 850 according to this embodiment has boosting circuits BOOST1–BOOSTn connected together in series, which simultaneously carry out a boosting operation. Thus, the boosting unit 850 produces a boosted voltage Vrea1, Vrea2, ..., or Vream having a voltage level sufficient to perform a desired operation of a semiconductor memory device, and obtains that boosted voltage at high speed. The final boosting circuit BOOSTn includes a plurality of boosters BOOSTn1–BOOSTnm, each of which has an output terminal. The boosting unit 850 can thereby prevent deterioration of the boosting efficiency otherwise caused by an increase in capacitance of an output terminal, and can thereby minimize an increase in chip area. This enables the boosting unit 850 to exert greater efficiency, even as the integration level of a semiconductor memory device increases.

A read voltage Vrea from the boosting units 750 and 850 according to the first and second embodiment of the invention has a predetermined voltage level (about 3.5V~5V), and is boosted up with high speed. The boosting unit 750 has a switching circuit SW included as part of the boosting circuit BOOSTn of its final terminal, so that a voltage level of an output terminal of the boosting circuit BOOSTn can be maintained at a power supply voltage VCC level while the read voltage Vrea is discharged after completion of the read operation. The boosting signals PBOOST1–PBOOSTn are sequentially enabled to sequentially discharge boosted voltages Vboost1–Vboostn, which have been charged to the output terminals of the boosting circuits BOOST1–BOOSTn, respectively.

Figure 15:
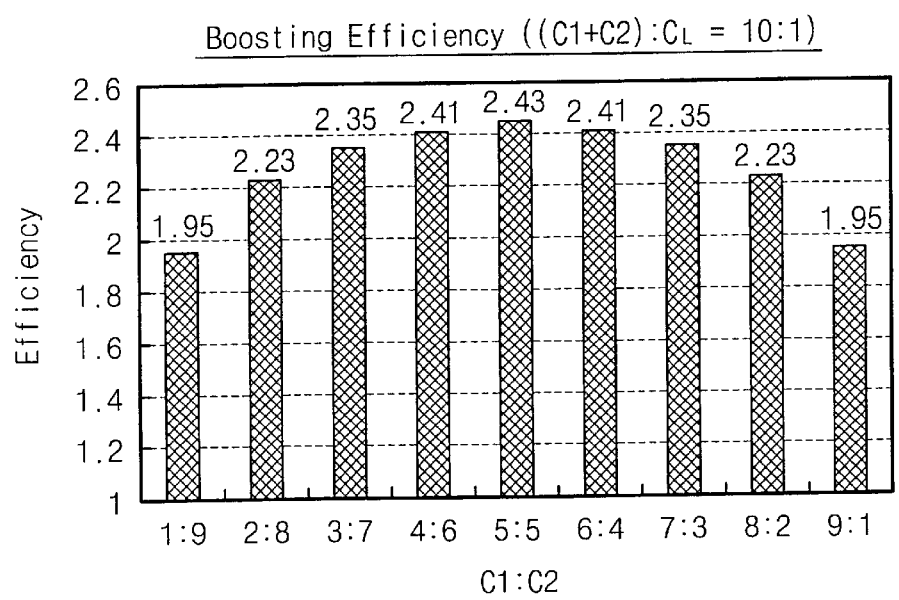
FIG. 15 is a graph showing the variation of boosting efficiency in relation to a capacitance ratio in a boosting unit constructed according to an embodiment of the invention.

As can be seen in FIG. 15, the boosting efficiency of the boosting units 750, 850 is determined by a capacitance ratio of capacitor circuits 753, 852 of boosting circuits BOOST1–BOOSTn to an output capacitor 755, 854 connected to an output terminal of the boosting circuit BOOSTn of the final terminal, and by selective actuation of the PMOS transistors PM11–PM15 of the switch circuit 752. When the capacitance ratio of the capacitor circuit 753, 852 to the output capacitor 755, 854 is ten to one (10:1), the boosting efficiency of the boosting circuits 750, 850 is maximized.

In order to prevent influx of a high voltage during a program or other operation, following completion of a read operation, a secondary switch circuit SW can be connected to the output terminal of the boosting unit 850, as in the boosting unit 750. As shown in FIG. 8B, the output terminal of the boosting unit (or read voltage generation circuit) 750 is connected to output terminals of the program voltage generation circuit 710 and the read voltage generation circuit 730 through a supplemental switch circuit SW so that a program voltage Vpgm or an erase voltage Vera is inputted to the boosting unit 750 during a write operation, following completion of the read operation. To suppress this phenomenon, the secondary switch circuit SW turns on each of the twenty-fourth through twenty-eighth PMOS transistors PM24–PM28 by controlling a read stop signal. This enables both terminals of each of the capacitors C1, C2, C3, C4, C5 in the final boosting circuit BOOSTn to have an identical voltage level with one another.

In summary, a boosting unit 750, 850 includes a plurality of boosting circuits BOOST1–BOOSTn connected in series, which simultaneously carry out a boosting operation under the control of the corresponding boosting signals PBOOST1–PBOOSTn. The boosting circuits BOOST1–BOOSTn have a serial architecture and output a boosted voltage Vrea having a required voltage level. Thus, the boosted voltage Vrea can be outputted with high speed.

In the boosting unit 850 of the later described embodiment, a plurality of boosted voltages Vrea1–Vream are selectively outputted through an output terminal corresponding to an external address ADD, preventing deterioration of boosting efficiency caused by increase in capacitance of the output terminal. Thus, it is possible to reduce the increase in the area of a semiconductor memory device.

While a semiconductor memory device of the present invention has been explained according to various preferred embodiments thereof, each of the embodiments shown and described are merely exemplary, and can be changed in arrangement and detail without departing from the principles of the present invention. Accordingly, the applicant claims all embodiments and aspects coming within the spirit and scope of the appended claims.

What is claimed is:

1. A boosting unit for generating a boosted voltage having a voltage level higher than a power supply voltage level, said boosting unit comprising:

a plurality of boosting circuits connected together in series, wherein each of the boosting circuits is configured to boost an input voltage to produce an output voltage at an output terminal, wherein each of the boosting circuits is configured to operate in response to a corresponding boosting signal, wherein each of the boosting signals is configured to be enabled and disabled simultaneously with each of the other boosting signals, and wherein a final boosting circuit comprises a boosting control circuit for controlling boosting efficiency of a final boosted voltage in response to a boosting selection signal.

2. A boosting unit according to claim 1, wherein each of the boosting circuits comprises:

a precharge circuit for charging the output terminal of the boosting circuit with a precharge voltage in response to a precharge signal;

a capacitor circuit connected to the output terminal of the boosting circuit; and a switching circuit for connecting the capacitor circuit to a first or a second power supply voltage to selectively charge or discharge the capacitor circuit in response to the corresponding boosting signal, and wherein the capacitor circuit comprises a first terminal connected to the corresponding switching circuit, and a second terminal connected to the output terminal of the boosting circuit, and wherein the switching circuit comprises first and second switching transistors, the first switching transistor being connected between the first power supply voltage and the first terminal of the boosting capacitor and configured to be switched by the corresponding boosting signal, and the second switching transistor being connected between the second power supply voltage and the first terminal of the boosting capacitor and configured to be switched by the corresponding boosting signal.

3. A boosting unit for generating a boosted voltage having a voltage level higher than a power supply voltage level, said boosting unit comprising:

a plurality of boosting circuits connected together in series, each boosting circuit comprising a precharge circuit for charging the output terminal of the boosting circuit with a precharge voltage in response to a precharge signal, a capacitor circuit connected to the output terminal of the boosting circuit, and a switching circuit for connecting the capacitor circuit to a first or a second power supply voltage to selectively charge or discharge the capacitor circuit in response to the corresponding boosting signal, wherein each of the boosting circuits is configured to boost an input voltage to produce an output voltage at an output terminal, wherein each of the boosting circuits is configured to operate in response to a corresponding boosting signal, wherein each of the boosting signals is configured to be enabled and disabled simultaneously with each of the other boosting signals, and wherein the capacitor circuit comprises a plurality of boosting capacitors, said capacitor circuit having a first terminal connected to the switching circuit and a second terminal connected to the output terminal of the boosting circuit, the boosting capacitors being connected together in parallel.

4. A boosting unit for generating a boosted voltage having a voltage level higher than a power supply voltage level, said boosting unit comprising:

a plurality of boosting circuits connected together in series, each boosting circuit comprising a precharge circuit for charging the output terminal of the boosting circuit with a precharge voltage in response to a precharge signal, a capacitor circuit connected to the output terminal of the boosting circuit, and a switching circuit for connecting the capacitor circuit to a first or a second power supply voltage to selectively charge or discharge the capacitor circuit in response to the corresponding boosting signal, wherein each of the boosting circuits is configured to boost an input voltage to produce an output voltage at an output terminal, wherein each of the boosting circuits is configured to operate in response to a corresponding boosting signal, wherein each of the boosting signals is configured to be enabled and disabled simultaneously with each of the other boosting signals, and wherein the switching circuit comprises:

a plurality of first switching transistors connected between the first power supply voltage and a first terminal of a corresponding boosting capacitor, said first switching transistors configured to be switched by the corresponding boosting signal; and a plurality of second switch transistors being connected between the second power supply voltage and the first terminal of the corresponding boosting capacitor, said second switching transistors being configured to be swished by the corresponding boosting signal.

5. A boosting unit according to claim 4, wherein the boosting control circuit includes a plurality of third switch transistors each having a current path and a gate, the current path being formed between a corresponding first switch transistor and second switch transistor, and the gate being controlled by a corresponding boosting selection signal.

6. A boosting unit for generating a boosted voltage having a voltage level higher than a power supply voltage level, the boosting unit comprising:

a plurality of boosting circuits connected in series, wherein each of the boosting circuits boosts up an input voltage in response to a corresponding boosting signal and outputs an output voltage that is higher than the input voltage; and a boosting control unit for generating a boosting control signal to control a final boosting circuit in response to a boosting signal and a row address, wherein the final boosting circuit selectively outputs a final boosted voltage through an output terminal thereof that corresponds to the row address, in response to the boosting control signal.

7. A boosting unit according to claim 6, wherein each of the boosting circuits includes:

a precharge circuit for precharging the output terminal of the boosting circuit with a precharge voltage in response to a precharge signal;

a capacitor circuit connected to the output terminal of the boosting circuit; and a switching circuit for connecting the capacitor circuit to a first or a second power supply voltage to charge or discharge the capacitor circuit in response to the corresponding boosting signal.

8. A boosting unit according to claim 6, wherein the final boosting circuit further comprises a boosting control circuit for controlling a boosting efficiency of a final boosted voltage in response to a plurality of boosting selection signals.

9. A boosting unit according to claim 6, wherein the boosting control unit further comprises a plurality of control circuits for outputting the boosting control signals in response to the boosting signal and a corresponding one of the row addresses, wherein each of the boosting control circuits comprises:

a NAND-type gate for generating an output signal by NAND-gating the boosting signal and the corresponding row address; and a level shifter for receiving a boosted voltage from a previous one of the boosting circuits and for supplying the boosted voltage to a corresponding boosting circuit in response to the output signal from the NAND-type gate.

10. A boosting unit according to claim 7, wherein the capacitor circuit comprises a first terminal connected to the corresponding switching circuit and a second terminal connected to the output terminal of the corresponding boosting circuit, and wherein the switching circuit comprises a first transistor connected between the first power supply voltage and the first terminal of the boosting capacitor, the first transistor configured to be switched by the corresponding boosting signal; and a second transistor connected between the second power supply voltage and the first terminal of the boosting capacitor, the second transistor configured to be switched by the corresponding boosting signal.

11. A boosting unit according to claim 7, wherein the capacitor circuit comprises a plurality of boosting capacitors each having a second terminal connected to the output terminal of a corresponding boosting means and a first terminal connected to a corresponding switching circuit, and wherein the boosting capacitors are connected together in parallel.

12. A boosting unit according to claim 8, wherein the switching circuit comprises:

a plurality of first switching transistors, each connected between the first power supply voltage and a first terminal of a boosting capacitor, and configured to be switched by the corresponding boosting signal; and a plurality of second switching transistors, each connected between the second power supply voltage and the first terminal of the boosting capacitor, and configured to be switched by the corresponding boosting signal.

* * * * *

UNITED STATES PATENT AND TRADEMARK OFFICE
CERTIFICATE OF CORRECTION

PATENT NO.    : 6,614,292 B1
DATED         : September 2, 2003
INVENTOR(S)   : Chung et al.

It is certified that error appears in the above-identified patent and that said Letters Patent is hereby corrected as shown below:

Column 2,
Line 67, "circuit 73, and, a read" should read -- circuit 73, and a read --.

Column 8,
Line 12, "inverters 14 - 16 of" should read -- inverters I4 - I6 of --.
Line 25, "converter 13 of" should read -- converter I3 of --.
Line 30, "inverter 16 of" should read -- inverter I6 of --.

Column 10,
Lines 51 and 57, "signal ATD_T is" should read -- signal ATD_BT is --.

Column 11,
Line 32, "N1, N2, or Nn-1" should read -- N1, N2, ..., or Nn-1 --.

Column 12,
Line 39, "circuit BOOST n-1" should read -- circuit BOOSTn-1 --.

Column 16,
Line 50, "to be swished by the" should read -- to be switched by the --.

Signed and Sealed this

Ninth Day of December, 2003

JAMES E. ROGAN
*Director of the United States Patent and Trademark Office*